United States Patent [19]
Riley, Jr.

[11] Patent Number: 4,476,445
[45] Date of Patent: Oct. 9, 1984

[54] METHODS AND APPARATUS FOR RAPID AND ACCURATE FREQUENCY SYNTONIZATION OF AN ATOMIC CLOCK

[75] Inventor: William J. Riley, Jr., Hamilton, Mass.

[73] Assignee: EG&G, Inc., Wellesley, Mass.

[21] Appl. No.: 379,300

[22] Filed: May 18, 1982

[51] Int. Cl.³ .............................................. H03L 7/26
[52] U.S. Cl. .......................................... 331/3; 331/44; 331/94.1
[58] Field of Search ............................ 331/3, 94.1, 44

[56] References Cited

U.S. PATENT DOCUMENTS 3,798,565  3/1974  Jechart ............................... 331/94.1
3,862,365  1/1975  Kobayashi et al. .................... 358/17

OTHER PUBLICATIONS

Brousseau R. et al., "An Electronic System For The Tuning Of Masers" *IEEE Trans. on Instrumentation and Measurement*, vol. IM-22, #4, pp. 367-375, Dec. 1973.
Flanagan et al., "Hardening Frequency Standards for Space Applications", IEEE Transactions on Nuclear Science, vol. NS-24, No. 6, Dec. 1977, pp. 2252-2258.
Matsuda et al., "Signal Intensity Characteristics of the $^{87}$Rb Double Resonance Due to the Pumping Light", Japanese J. of Appl., Physics, vol. 16, No. 3, Mar. 1977, pp. 391-396.

*Primary Examiner*—Siegfried H. Grimm
*Assistant Examiner*—David C. Mis
*Attorney, Agent, or Firm*—Finnegan, Henderson, Farabow, Garrett & Dunner

[57] ABSTRACT

Methods and apparatus for rapidly and automatically syntonizing the frequency of a passive atomic resonator of an atomic clock with a reference frequency which corresponds to the frequency of an external reference signal. Any difference between the hyperfine transition frequency of the resonator and the reference frequency generates an error signal which is used as a basis for automatically determining the magnitude of a quantity which adjusts the actual hyperfine transition frequency of the resonator.

18 Claims, 3 Drawing Figures

METHODS AND APPARATUS FOR RAPID AND ACCURATE FREQUENCY SYNTONIZATION OF AN ATOMIC CLOCK

BACKGROUND OF THE INVENTION

I. Field of the Invention

Present invention relates to methods and apparatus for syntonizing a passive atomic resonator with respect to a reference frequency.

II. Description of the Prior Art

The most common types of atomic clocks, also referred to as atomic frequency standards, include an oscillator whose frequency is accurately controlled through the utilization of a passive atomic resonator. The term "passive" as used herein is employed to distinguish such resonators from "active" resonators, such as atomic hydrogen masers, which are actually atomic oscillators. Typically through some combination of synthesizer and multiplier, the oscillator provides an interrogation signal which is used as a microwave frequency input to the passive atomic resonator. The passive atomic resonator has an inherent or natural frequency, and upon introduction of the interrogation signal, the passive atomic resonator provides an output error signal which is a function of the difference between the interrogation signal frequency and the natural frequency of the passive atomic resonator. This output error signal is utilized to control the frequency of the oscillator and thereby to control the frequency of the interrogation signal until the interrogation signal is locked to the natural frequency of the passive atomic resonator. The oscillator thereafter provides a highly accurate and stable frequency output signal for use as a frequency standard or atomic clock.

One well-known form of prior art passive atomic resonator employs a vapor of the alkali metal, rubidium, which has a natural hyperfine transition frequency of about 6835 megahertz. Such prior art passive atomic resonators employ a photo detector to provide the output error signal for control of the frequency of the oscillator. By processing the error signal from the photo detector, a control signal can be developed for adjusting the frequency of the oscillator in such a manner as to lock the interrogation signal frequency to the hyperfine frequency of the resonator.

Other forms of prior art passive atomic resonators which have potential application to the present invention include non-rubidium alkali vapor devices, beam tube devices, saturated absorption devices, and trapped ion devices, all of which provide an output error signal indicative of the difference between the frequency of an input interrogation signal and the frequency of the resonator.

The natural frequency of passive atomic resonators may fluctuate as a consequence of a number of influences. For example, in rubidium passive atomic resonators, fluctuation in the frequency of such resonators may occur due to variation in the intensity of a pumping light utilized to excite the alkali vapor atoms. Discoloration of glass and variations in temperature, electronic circuit parameters, and gas pressure are each capable of introducing shifts in the frequency of the resonator.

Provisions are made to allow for adjustment of the frequency of passive atomic resonators to thereby negate the adverse effect of shifts in the frequency thereof. Again, as an example, in rubidium passive atomic resonators a magnetic bias field, or C-field, is applied to separate the Zeeman levels of each hyperfine state of the vapor atoms. This separation, which is a function of the magnetic bias field, allows for selective altering of the frequency of the resonator, as is well-known to those skilled in the art.

Calibration, or frequency syntonization, of an atomic clock is accomplished in the prior art by removing the clock from operation and carefully measuring its output frequency with respect to an established reference frequency source. Prior art apparatus for measuring the frequency of an atomic clock is typically bulky and complicated. Once the absolute frequency of an atomic clock is measured, the variance of this frequency from the desired frequency is used to calculate the amount of variation to the magnetic bias field of the clock needed to establish a new magnetic bias field which will syntonize the frequency of the resonator to the reference frequency. The success of this frequency alignment, or syntonization, is determined by remeasuring the absolute frequency of the atomic clock after the magnetic bias field correction.

Typically, such prior art frequency syntonization methods may only be accomplished as part of a laboratory recalibration process. Moreover, such prior art frequency syntonization methods may have to be repeated several times in order to achieve a satisfactory frequency setting, and accordingly, such methods require on the order of 10 to 15 minutes for completion.

It is, therefore, an object of the present invention to provide methods and apparatus for rapidly and efficiently setting the frequency of a passive atomic resonator into close frequency agreement, syntonization, with a reference frequency established by a master external reference signal.

Another object of the present invention is to provide methods and apparatus for quickly performing syntonization of a passive atomic resonator in the field, particularly to provide frequency syntonization of a moderate precision tactical atomic clock.

A further object of the present invention to provide frequency syntonization hardware simple enough to be included within the simplest atomic clock.

Still a further object of the present invention is to provide apparatus and methods for controlling syntonization of the passive atomic resonator of an atomic clock automatically.

Still another object of the present invention is to provide methods and apparatus for frequency syntonization of a passive atomic resonator without the need for external frequency measurement.

Additional objects and advantages of the invention will be set forth in part in the description which follows, and in part will be obvious from the description or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described herein, there is provided a method for syntonizing the frequency of a passive atomic resonator of an atomic clock with respect to a reference frequency established by a reference signal, the atomic clock including input means for supplying a variable frequency interrogation signal to the resonator, output means for providing an error signal indicative of the difference between the frequency of the variable frequency interrogation signal and the frequency of the resonator, which error signal may be used to control the frequency of the variable frequency interrogation signal, and adjustment means for selectively altering the frequency of the resonator, the method of the present invention comprising the steps of: (a) replacing the variable frequency interrogation signal with a reference interrogation signal having the reference frequency, and (b) adjusting the frequency of the resonator by using the error signal to control operation of the adjustment means.

Preferably, the adjustment means includes means for creating a magnetic bias field, and the step of adjusting includes altering the magnetic bias field in response to the error signal. It is also preferable that the step of adjusting includes generating a digital signal indicative of whether the resonator frequency is above or below the frequency of the reference interrogation signal and employing that digital signal to control operation of the adjustment means. For example, the digital signal may be utilized to operate a successive approximation register with the output of the successive approximation register used to control operation of the adjustment means.

In a narrower sense, the present invention is directed toward a method for syntonizing the hyperfine transition frequency of an alkali vapor passive atomic resonator of an atomic clock with a reference frequency established by a reference signal, wherein the atomic clock includes a variable frequency crystal oscillator which provides the output signal of the clock, a multiplier-synthesizer to convert an output of the crystal oscillator into a variable frequency interrogation signal for the resonator, a servo amplifier circuit which generates a control signal to control the frequency of the oscillator as a function of the difference between the frequency of the variable frequency interrogation signal and the hyperfine transition frequency of the resonator, and magnetic field generating means for selectively altering the hyperfine transition frequency of the resonator, the method of the present invention comprising the steps of: (a) replacing the output of the oscillator with the reference signal as the input to the multiplier-synthesizer to thereby replace the variable frequency signal with a reference interrogation signal corresponding to the reference frequency; and (b) employing the error signal from the servo amplifier circuit to adjust operation of the magnetic field generator means to thereby automatically adjust the hyperfine transition frequency toward the reference frequency.

Preferably, the step of employing the error signal includes the substeps of: (a) processing the error signal to derive a detected error signal; (b) integrating the detected error signal to produce an integrated error signal; (c) comparing the integrated error signal to a threshold value to generate a digital comparison signal which indicates whether the hyperfine transition frequency of the resonator is greater than or less than that corresponding to the reference frequency; (d) applying the digital comparison signal to a successive approximation register; (e) converting the output of the successive approximation register to an analog signal; and (f) employing the analog signal to adjust operation of the magnetic field generating means.

In addition, the present invention includes apparatus for accomplishing the methods of the present invention.

DESCRIPTION OF THE DRAWINGS

The accompanying drawings, which are incorporated in and constitute a part of this specification, illustrate a preferred embodiment of the invention, and, together with the description, serve to explain the principles of the invention, wherein.

DETAILED DESCRIPTION OF THE PREFERRED EMBODIMENT

Reference will now be made in detail to the present preferred embodiment of the invention, an example of which is illustrated in the accompanying drawings.

Figure 1:
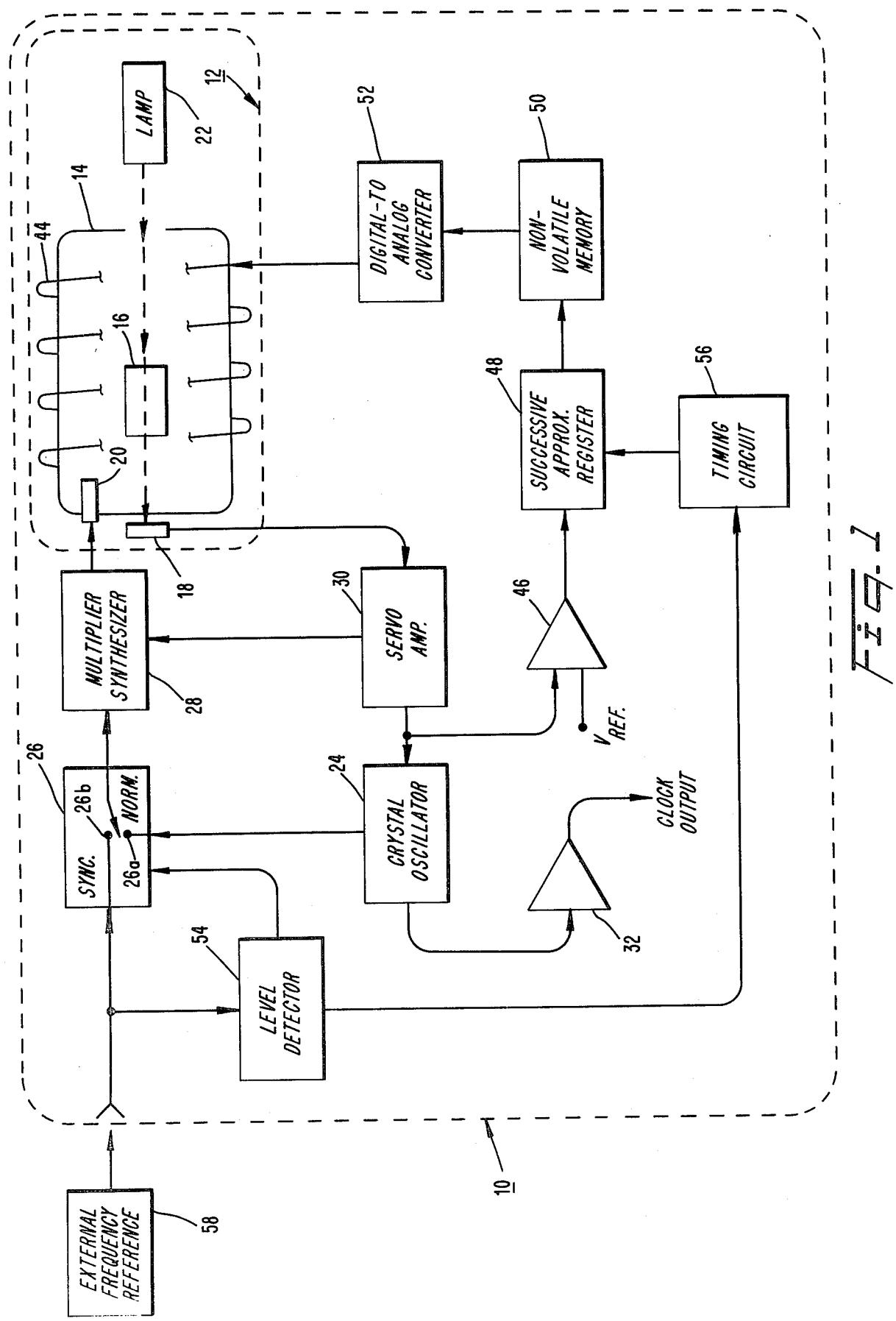
FIG. 1 is a block diagram of an atomic clock incorporating the teachings of the present invention.

In FIG. 1 there is shown an atomic clock 10 including a passive atomic resonator 12. As used herein, the term "atomic clock" is intended to include any form of atomic frequency or time standard which utilizes a passive atomic resonator. As shown in FIG. 1, passive atomic resonator 12 is illustrated in the form of a rubidium gas cell resonator by way of example and not limitation, since the present invention has anticipated application to all forms of passive atomic resonators, including non-rubidium alkali vapor devices, beam tube devices, saturated absorption devices, and trapped ion devices.

A "passive atomic resonator" is intended to include all atomic, subatomic, molecular, or ionic devices which have an inherent or natural frequency and which, upon introduction of an interrogation signal, provide an output error signal which is a function of the difference between the frequency of the interrogation signal and the natural frequency of the resonator. For application to the present invention, it is also necessary that there be some form of stimulus which may be applied to the resonator to change the natural frequency of the resonator.

Passive atomic resonator 12 is illustrated in FIG. 1 as including a microwave cavity 14, a resonator cell 16, a photo detector 18, and a microwave input link or probe 20. As is well-known to those skilled in the art, a lamp 22 preferably of the same material as resonator cell 16, such as $Rb^{87}$, is employed to optically pump resonator cell 16. The amount of optical energy absorbed by resonator cell 16 is detected as an output error signal generated by operation of photo detector 18. As is also well-known to those skilled in the art, microwave energy introduced into microwave cavity 14 by input probe 20 serves to relax the atoms within resonator cell 16 and thereby affect the throughput of light from lamp 22 to photo detector 18. In other words, the signal applied to microwave cavity 14 by microwave input probe 20 provides a vehicle for interrogating the hyperfine transition frequency of resonator cell 16 with this interrogation being reflected in the value of the output signal from photo detector 18. The output of photo detector 18, accordingly, can indicate both the magnitude and direction of any difference between the frequency of an interrogation signal introduced into microwave cavity 14 by microwave input probe 20 and the hyperfine transition frequency of resonator cell 16. Again, these are matters all well-known to those skilled in the art.

Atomic clock 10 of FIG. 1 further includes an oscillator, shown by way of example as a crystal oscillator 24, a switch 26 having a normal terminal 26a and a syntonization terminal 26b, a multiplier-synthesizer 28, and a servo amplifier circuit 30. Crystal oscillator 24 has an output connected to the input of multiplier-synthesizer 28 through switch 26. The output of multiplier-synthesizer 28 is coupled to resonator 12 through microwave input probe 20. An input to crystal oscillator 24 is provided from an output of servo amplifier 30 with a second output of servo amplifier circuit 30 providing a second input to multiplier-synthesizer 28. The output of photo detector 18 is coupled to the input of servo amplifier 30. The output of crystal oscillator 24 is coupled to an output buffer amplifier 32 which provides a clock output for atomic clock 10 and isolates that output from crystal oscillator 24.

In operation, an error signal from photo detector 18 is delivered to servo amplifier 30 which operates upon that error signal to provide a control signal to control the frequency of crystal oscillator 24. The output of crystal oscillator 24 is, in turn, increased in frequency due to the operation of multiplier-synthesizer 28 when switch 26 is in its normal mode engaging normal terminal 26a. Accordingly, the frequency of the interrogation signal provided by multiplier-synthesizer 28 to resonator 12 at microwave input probe 20 is governed by the control signal output of servo amplifier circuit 30.

In the normal mode of operation, the control signal output of servo amplifier 30 operates to control the frequency of crystal oscillator 24 in such a manner that the frequency of the interrogation signal becomes locked to the hyperfine transition frequency of resonator 12. Accordingly, crystal oscillator 24 may provide a highly accurate, stable frequency signal output to multiplier-synthesizer 28 which operates in a well-known manner to convert the typically standard universally usable, rounded-off oscillation frequency of crystal oscillator 24 into the particular unique natural value of the hyperfine transition frequency of resonator 12.

Figure 2:
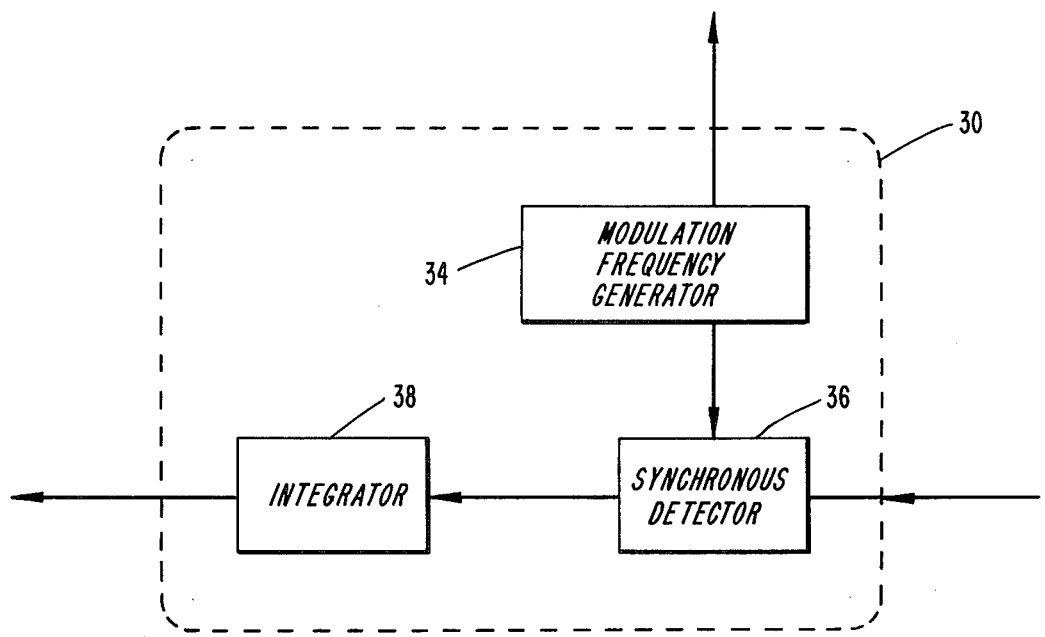
FIG. 2 is a schematic block diagram of an example of a servo circuit illustrated in FIG. 1.

FIG. 2 provides an example of an illustrative embodiment of servo amplifier circuit 30. As shown therein servo amplifier circuit 30 includes a modulation frequency generator 34, a synchronous detector 36, and an integrator 38. The output of modulation frequency generator 34 is coupled both to synchronous detector 36 and to multiplier-synthesizer 28 of FIG. 1. As is well-known, modulation frequency generator 34 operates to provide a modulation frequency on the interrogation signal introduced into microwave cavity 14 by multiplier-synthesizer 28. This same modulation frequency is simultaneously applied to synchronous detector 36. The input signal to synchronous detector 36 is provided by the output of photo detector 18, and the output of synchronous detector 36 is coupled to integrator 38 which in turn is coupled to crystal oscillator 24 of FIG. 1.

As should be apparent to those skilled in the art, modulation frequency generator 34 allows synchronous detector 36 to demodulate the error signal provided by photo detector 18, thereby to derive from the modulated error signal a detected error signal which reflects any difference between the interrogation signal frequency and the natural frequency of atomic resonator 12. When the detected error in the demodulated error signal provided by photo detector 18 is at a minimum, the frequency of the interrogation signal induced by microwave input probe 20 into resonator 12 is equal, or locked, to the hyperfine transition frequency of resonator 12. At this frequency, synchronous detector 36 will have as its output a substantially zero-value DC signal for integration by integrator 38. At other frequencies, the output of integrator 38 provides a control signal to control the frequency of crystal oscillator 24 in such a manner as to reattain a lock between the interrogation signal frequency and the hyperfine transition frequency.

Figure 3:
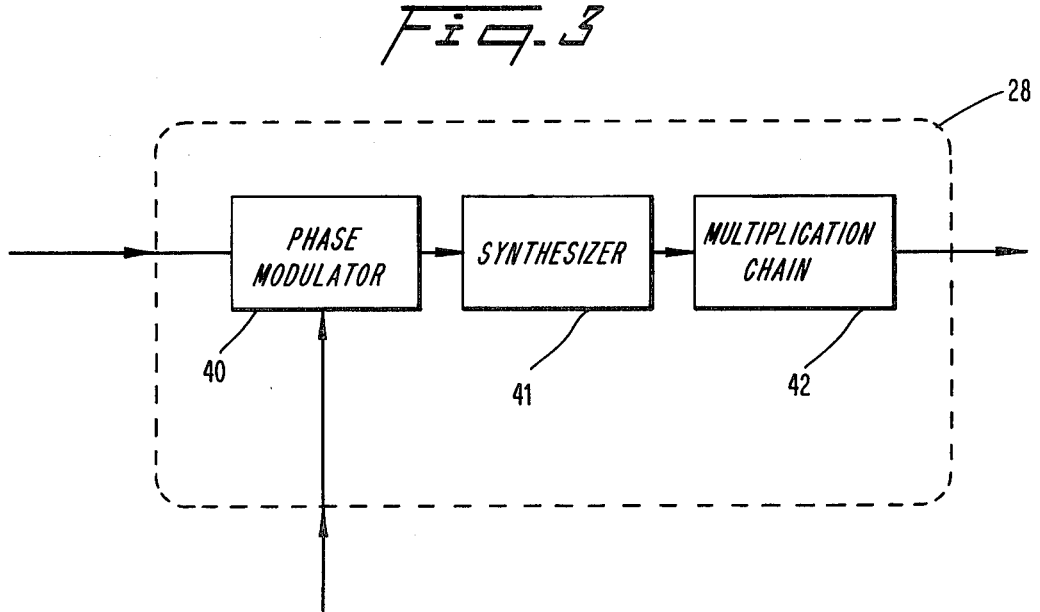
FIG. 3 is a schematic block diagram of one example of a multiplier-synthesizer means illustrated in FIG. 1.

FIG. 3 provides an illustrative example of multiplier-synthesizer 28 and shows multiplier-synthesizer 28 as including a phase modulator 40, a synthesizer 41, and a multiplication chain 42. Many alternative arrangements are suitable to generate an appropriate interrogation signal. Phase modulator 40 receives as an input the output of crystal oscillator 24 through the operation of switch 26 and provides an output to synthesizer 41. As described above, phase modulator 40 is coupled to also receive the output of modulation frequency generator 34. The output of synthesizer 41 is in turn coupled to the input of multiplication chain 42 which provides as an output to microwave input probe 20 a variable frequency interrogation signal, the variable frequency of which is dependent upon the operation of crystal oscillator 24. More specifically, phase modulator 40 operates to modulate the frequency of the output of crystal oscillator 24, synthesizer 41 operates to alter the frequency of the modulated signal, and multiplier chain 42 operates to increase that altered frequency. As the frequency of crystal oscillator 24 is varied, the output of multiplier-synthesizer 28 is varied. Hence the interrogation signal supplied to input probe 20 is of a variable frequency variety. It is possible to eliminate synthesizer 41 from multiplier-synthesizer 28 by operating crystal oscillator 24 at a non-standard frequency; however, in such an instance it is common for a synthesizer to be used between crystal oscillator 24 and output buffer amplifier 32 to convert the non-standard frequency of crystal oscillator 24 into one standardized for acceptable use as a clock output.

In summary, atomic clock 10 as illustrated in FIG. 1 includes a multiplier-synthesizer 28 for supplying a variable frequency interrogation signal to resonator 12 and a photo detector 18 which provides to servo amplifier circuit 30 an error signal indicative of the difference between the frequency of the variable interrogation signal provided to resonator 12 and the hyperfine transition frequency of resonator 12. The error signal as applied to servo amplifier 30 is used to control the frequency of crystal oscillator 24 and thereby to control the frequency of the variable frequency integration signal provided by multiplier-synthesizer 28 to resonator 12.

Atomic clock 10 of FIG. 1 further includes a magnetic coil 44 illustrated as shown encircling microwave cavity 14. As should be apparent to those skilled in the art, magnetic coil 44 may be utilized to generate in microwave cavity 14 a magnetic bias field, or C-field, which operates to separate the Zeeman levels of each hyperfine state of the rubidium atoms within resonator cell 16 thereby allowing selected variation of the hyperfine transition frequency of resonator 12.

In accordance with the present invention, there is provided in an atomic clock means for replacing the variable frequency interrogation signal of such a clock with a reference interrogation signal having a reference frequency and means for adjusting the frequency of the resonator by using the error signal from the resonator. As illustratively shown in FIG. 1, by way of example and not limitation, there is provided in addition to switch 26, a comparator 46, a successive approximation register 48, a non-volatile memory 50, a digital-to-analog convertor 52, a level detector 54, and a timing circuit 56. The output of servo amplifier circuit 30 is coupled to one input of comparator 46, while a second input of comparator 46 is coupled to a threshold reference volta $V_{REF}$, which could comprise a coupling to ground. The output of comparator 46 is coupled to the input of successive approximation register 48, while the output of successive approximation register 48 is coupled to non-volatile memory 50. The output of non-volatile memory 50 is coupled to the input of digital-to-analog convertor 52, and the output of digital-to-analog convertor 52 is coupled to magnetic coil 44.

Moreover, as shown in FIG. 1 there is provided an external frequency reference source 58 which furnishes a reference signal to atomic clock 10. More specifically, external reference frequency source 58 is coupled to syntonization terminal 26b of switch 26. External frequency reference source 58 is also coupled to level detector 54, outputs of which are delivered both to switch 26 and to timing circuit 56. The output of timing circuit 56 is coupled to the input of successive approximation register 48.

External frequency reference source 58 provides a master or control frequency reference signal which has sufficient stability and accuracy to warrant use as a standard for setting the hyperfine transition frequency of resonator 12. When synthesizer 41 is located within multiplier-synthesizer 28, as in FIG. 3, external frequency source 58 may be of standard frequency; however, if synthesizer 41 is eliminated from multiplier-synthesizer 28 and relocated between crystal oscillator 24 and output buffer amplifier 32, as discussed above, then external frequency source 58 must be of non-standard frequency, imposing additional complications upon the calibration process. With switch 26 coupled in the syntonization mode by engaging syntonization terminal 26b, the reference signal from external frequency reference source 58 replaces the output of crystal oscillator 24 as an input to multiplier-synthesizer 28. Accordingly, with switch 26 is in the syntonization mode, the variable frequency interrogation signal present at microwave input probe 20 when switch 26 in the normal mode is replaced with a reference interrogation signal having a highly accurate and stable reference signal dictated by the operation of external frequency reference source 58. Thus, with switch 26 in the syntonization mode, the output of photo detector 18 provides an error signal indicative of the difference between the frequency of the reference interrogation signal provided at microwave input probe 20 and the hyperfine transistion frequency of resonator 12. In other words, the control loop of atomic clock 10, including resonator 12, servo amplifier 30, crystal oscillator 24, multiplier-synthesizer 28, and input probe 20 is broken when switch 26 is placed in the syntonization mode, with the output of crystal oscillator 24 no longer being used to influence control of atomic clock 10.

With switch 26 coupled in the syntonization mode, servo amplifier 30 provides a control signal to comparator 46 which is indicative of the difference between the variable interrogation signal provided at microwave input probe 20 and the hyperfine transition frequency of resonator 12. Comparator 46 compares this control signal with threshold reference signal $V_{REF}$ and provides as an output a digital comparison signal indicative of whether the frequency of the reference interrogation signal provided at microwave input probe 20 is greater than or less than the hyperfine transition frequency of resonator 12. The output of comparator 46 thereby permits a high resolution determination of any difference between the hyperfine transition frequency of resonator 12 and the frequency of the reference interrogation signal appearing at input probe 20.

For a typical case in which integrator 38 of servo amplifier 30 has a time constant of 0.1 seconds and synchronous detector 36 of servo amplifier 30 has a sensitivity of $1 \times 10^{-9}$ per volt at the input to integrator 38, a frequency offset of $1 \times 10^{-11}$ would give a slew rate of 0.1 V/sec at the output of integrator 38. Accordingly, if comparator 46 had a threshold reference voltage $V_{REF}$ of 10 mv, comparator 46 would operate to detect the direction of the difference between the reference interrogation frequency and the hyperfine transition frequency in 0.1 seconds.

The digital output of comparator 46 is coupled to the input of successive approximation register 48. As is well-known, a successive approximation register operates to provide a digital output at each of a number of decision intervals, which digital output is successively caused to be brought into a closer and closer approximation of a correct value in response to the value of a digital input, in this case a digital input provided by comparator 46. The length of each decisional interval is dictated by the operation of a clock within timing circuit 56. In the case of a typical rubidium atomic clock, an 8-bit resolution is sufficient to adjust the hyperfine transition frequency of the resonator of such an atomic clock to within a few parts in $10^{11}$, and the syntonization process takes only a few seconds.

Successive approximation register 48 may, for example, comprise a Motorola model MC 14549B. The output of successive approximation register 48 may be coupled directly to digital-to-analog convertor 52 or may be coupled therewith through non-volatile memory 50. Digital-to-analog convertor 52 may, for example, comprise an R-2R ladder network such as a Beckman model 316 L08503 having at its output a buffer amplifier such as a National Semiconductor model LM 101A, and comparator 46 may, for example, comprise a National Semiconductor model LM 111.

The output of digital-to-analog convertor 52 is thereby used to control current provided to magnetic field coil 44. The use of non-volatile memory 50 allows the most recent frequency synchronization data generated by successive approximation register 48 to be stored indefinitely, even if the clock of timing circuit 56 is turned off. Accordingly, the inclusion of non-volatile memory 50 is deemed preferable.

As shown in FIG. 1, level detector 54 detects the presence of a signal from external frequency reference source 58; so that upon detection, level detector 54 operates to move switch 26 out of engagement with normal terminal 26a and into engagement with syntonization terminal 26b. In addition, upon detection of the reference signal, level detector 54 activates timing circuit 56, which initiates operation of successive approximation register 48.

It is to be understood that the utilization of comparator 46, successive approximation register 48, and digital-to-analog convertor 52 provides but a single illustrative and non-limiting example of an apparatus which may utilize the error signal from resonator 12 to control the value of the magnetic field established by coil 44 and thereby adjust the frequency of resonator 12 toward the frequency of the reference interrogation signal dictated by the operation of a master external reference frequency source. Alternative circuits achieving this result could be provided by those skilled in the art using the teachings of the present invention.

It is possible, for example, to control the current to magnetic field coil 44 in analog fashion without recourse to conversion of the output of servo 30 into digital form. In this manner of practicing the invention, an output of servo 30 is supplied directly as the input to magnetic field coil 44, obviating the need for the electronics represented by comparator 46, successive approximation register 48, non-volatile memory 50, digital-to-analog convertor 52, and timing circuit 56. A significant disadvantage results however, in that a convenient digital signal means for memory storage of the proper C-field value required for syntonization is not developed. Accordingly, the scope of the present invention is intended to extend beyond the specific embodiment illustrated in FIG. 1.

In summary, in a syntonization mode of operation radio frequency electromagnetic oscillations are generated by multiplier-synthesizer 28 as a function of the reference frequency provided by external frequency source 58. Switching means illustrated by switch 26 is capable of selectively applying either the external reference signal of external frequency source 58 or the output of crystal oscillator 24 to the input of multiplier-synthesizer 28. During normal operation, the output of crystal oscillator 24 is applied directly to multiplier-synthesizer 28 through switch 26.

Magnetic coil 44 provides an illustrative example of magnetic field means disposed to create a magnetic field bias in the passive atomic resonator in an atomic clock, thereby to effect a shift in the normal hyperfine transition frequency of the resonator.

Passive atomic resonator 12 provides an error signal when the modulated radio frequency electromagnetic oscillations of the reference interrogation signal are applied to microwave cavity 14. This error signal is a function of the difference between the frequency of the radio frequency electromagnetic oscillations and the hyperfine transition frequency of the resonator. The output error signal is applied to a servo mechanism which preferably comprises a synchronous detector which receives the error signal from the resonator and, as a consequence of this error signal, is able to develop a demodulated detected error signal which drives an integrator. A modulation frequency generator is also provided to generate a modulation signal for utilization both by the synchronous detector and by the multiplier-synthesizer. When the detected error signal of the output error signal of the resonator is at a minimum, the radio frequency electromagnetic oscillations are syntonized with the hyperfine transition frequency of the resonator. At this frequency, the synchronous detector will have as its output a substantially zero-value DC signal which is introduced to the input of the integrator.

The output of the integrator serves two distinct functions. In the normal mode of operation the output of the integrator controls the frequency of the crystal oscillator, and in the syntonization mode of operation the output of the integrator is used to adjust the hyperfine transition frequency of the resonator. In the syntonization mode, the atomic clock is operated in an open loop, with the signal of the external frequency reference source replacing the normal crystal oscillator input to the multiplier-synthesizer. This permits a high-resolution determination of the frequency difference between the hyperfine transition frequency of the passive atomic resonator and the external frequency of the external frequency reference source by simply observing the output of the integrator.

As set forth above, the output of the integrator is provided to a comparator which drives the data input for a successive approximation register the digital output of which is converted to an analog signal that controls the magnetic field bias of the passive atomic resonator. In order that each decision of the successive approximation register be unbiased by previous decision, it is preferable that the integrator within the servo amplifier circuit be operated in an integrate-and-dump manner, with its output starting at zero for each decision period.

In accordance with the above teachings, it is possible to bring the hyperfine transition frequency of a passive atomic resonator into close agreement, or syntonization, with a frequency determined by an external master reference.

The precision of the syntonization method and apparatus of the present invention is a function of the discriminator characteristics of the passive atomic resonator, and is therefore naturally consistent with the precision of the resonator. A higher Q atomic resonator would automatically be capable of being syntonized with greater precision by this method. The prior art means of syntonization using external frequency measuring means, however, become more complex as higher precision is required. Accordingly, the present invention provides an advantageous method and apparatus for application to future high performance passive atomic frequency standards, such as trapped ion devices currently under investigation, which operate with higher hyperfine resonant frequencies and narrower line widths.

It should further be understood that means other than a DC magnetic field may be used to adjust the hyperfine resonant frequency of a passive atomic resonator in accordance with the teachings of the present invention. For example, an electric field (Stark effect) might be suitable for some forms of passive atomic resonators.

Various constructions and modifications of the methods and apparatus of the present invention will become apparent to those skilled in the art in view of the teachings set forth herein, without departing from the spirit or the scope of the invention. The invention in its broader aspects is, therefore, not limited to the specific details of the representative apparatus and the illustrative preferred embodiment shown and described herein. Thus, it is intended that the present invention cover the various constructions and modifications of this invention provided they come within the scope of the appended claims or their equivalents.

What is claimed:

1. A method for syntonizing the frequency of a passive atomic resonator of an atomic clock with respect to a reference frequency established by a reference signal, the atomic clock including input means for supplying a variable frequency interrogation signal to said resonator, output means for providing an error signal indicative of the difference between the frequency of said variable interrogation signal and the frequency of said resonator which error signal may be used to control the frequency of said variable interrogation signal, and adjustment means for selectively altering the frequency of said resonator, said method comprising the steps of:

a. replacing said variable frequency interrogation signal with a reference interrogation signal having said reference frequency; and b. adjusting the frequency of said resonator by using said error signal to control operation of said adjustment means.

2. The method of claim 1 wherein said adjustment means includes means for creating a magnetic bias field and said step of adjusting includes altering said magnetic bias field in response to said error signal.

3. The method of claim 1 wherein said step of adjusting includes generating a digital signal indicating whether said frequency of said resonator is above or below the frequency of said reference interrogation signal and employing said digital signal to control operation of said adjustment means.

4. The method of claim 3 wherein said step of adjusting further includes using said digital signal to operate a successive approximation register, and employing the output of said successive approximation register to control operation of said adjustment means.

5. The method of claim 1 wherein said step of replacing includes detecting the presence of said reference signal and, in response thereto, replacing said variable frequency interrogation signal with said reference interrogation signal.

6. The method of claim 1 wherein said means for supplying a variable frequency interrogation signal includes a variable frequency oscillator and a multiplier-synthesizer having an input thereof coupled to the output of said oscillator to provide said variable frequency interrogation signal, and said step of replacing includes substituting said reference signal for said output of said oscillator coupled to said input of said multiplier-synthesizer.

7. A method for syntonizing the hyperfine transition frequency of an alkali vapor passive atomic resonator of an atomic clock with a reference frequency established by a reference signal, the atomic clock including a variable frequency crystal oscillator which provides the output signal of the clock, a multiplier-synthesizer to convert an output of said crystal oscillator into a variable frequency interrogation signal for said resonator, a servo amplifier circuit which generates a control signal to control the frequency of said oscillator as a function of the difference between the frequency of said variable frequency interrogation signal and said hyperfine transition frequency of said resonator, and magnetic field generating means for selectively altering said hyperfine transition frequency, said method comprising the steps of:

a. replacing said output of said oscillator with said reference signal as the input to said multiplier-synthesizer to thereby replace said variable frequency interrogation signal with a reference interrogation signal having said reference frequency; and b. employing said error signal from said servo amplifier circuit to adjust operation of said magnetic field generating means to thereby automatically adjust said hyperfine transition frequency toward said reference frequency.

8. The method of claim 7 wherein said step of employing includes the substeps:

a. processing said error signal to derive a detected error signal;

b. integrating said detected error signal to produce an integrated error signal; and c. employing said integrated error signal to adjust operation of said magnetic field generating means.

9. The method of claim 7 wherein said step of employing includes the substeps:

a. processing said error signal to derive a detected error signal;

b. integrating said detected error signal to produce an integrated error signal;

c. comparing said integrated error signal to a threshold value to generate a digital comparison signal which indicates whether said hyperfine transition frequency is greater than or less than said reference frequency;

d. applying said digital comparison signal to a successive approximation register;

e. converting the output of said successive approximation register to an analog signal; and f. employing said analog signal to adjust operation of said magnetic field generating means.

10. An apparatus for syntonizing the frequency of a passive atomic resonator of an atomic clock with a reference frequency established by a reference signal, comprising:

a. input means for supplying a variable frequency interrogation signal to said resonator;

b. output means for providing an error signal from said resonator indicative of the difference between the frequency of said variable interrogation signal and the frequency of said resonator;

c. servo means for controlling the frequency of said variable interrogation signal as a function of said error signal;

d. means for replacing said variable interrogation signal with a reference interrogation signal having said reference frequency; and e. means for adjusting the frequency of said resonator in response to said error signal when said reference interrogation signal replaces said variable frequency interrogation signal.

11. The apparatus of claim 10 wherein said means for adjusting includes means for creating a magnetic bias field within said resonator which bias field is controlled in response to said error signal.

12. The apparatus of claim 10 wherein said means for adjusting includes means for generating a digital signal indicative of whether the frequency of said resonator is above or below the frequency of said reference interrogation signal, and means for employing said digital signal to control operation of said adjustment means.

13. The apparatus of claim 12 wherein said means for generating a digital signal includes a successive approximation register with the output of said successive approximation register coupled to control operation of said adjustment means.

14. The apparatus of claim 10 wherein said means for replacing includes means for detecting the presence of said reference signal and, in response thereto, replacing said variable frequency interrogation signal with said reference interrogation signal.

15. The apparatus of claim 10 wherein said means for supplying a variable frequency interrogation signal includes a variable frequency oscillator and a multiplier, an input of said multiplier coupled to the output of said oscillator to provide said variable frequency interrogation signal, and wherein said means for replacing includes means for substituting said reference signal for said output of said oscillator coupled to said input of said multiplier.

16. An apparatus for syntonizing a hyperfine transition frequency of an alkali vapor passive atomic resonator of an atomic clock with a reference frequency established by a reference signal comprising:
   a. a variable frequency oscillator which provides an output signal of said atomic clock;
   b. a multiplier-synthesizer coupled to convert an output of said oscillator into a variable frequency interrogation signal for application to said resonator;
   c. a detector circuit for generating an error signal to control the frequency of said oscillator as a function of the difference in frequency between said variable frequency interrogation signal and said hyperfine transition frequency of said resonator;
   d. magnetic field generating means for selectively altering said hyperfine transition frequency of said resonator;
   e. means for replacing said output of said oscillator with said reference signal as an input to said multiplier-synthesizer to thereby replace said variable frequency interrogation signal with a reference interrogation signal having said reference frequency; and
   f. means for employing said error signal from said detector circuit upon application of said reference interrogation signal to said resonator to adjust operation of said magnetic field generating means to thereby automatically adjust said hyperfine transition frequency toward said reference frequency.

17. The apparatus of claim 16 wherein said means for employing includes:
   a. means for processing said error signal to derive a detected error signal;
   b. means for integrating said detected error signal to produce an integrated error signal; and
   c. means for employing said integrated error signal to adjust operation of said magnetic field generating means.

18. The apparatus of claim 16 wherein said means for employing includes:
   a. means for processing said error signal to derive a detected error signal;
   b. means for integrating said detected error signal to produce an integrated error signal;
   c. means for comparing said integrated error signal to a threshold value to generate a digital comparison signal which indicates whether said hyperfine transition frequency is greater than or less than said reference frequency;
   d. successive approximation register means coupled to receive said digital error signal;
   e. means for converting the output of said successive approximation register means to an analog signal; and
   f. means for employing said analog signal to adjust operation of said magnetic field generating means.

* * * * *